US012813137B2

(12) United States Patent
Oh et al.

(10) Patent No.: US 12,813,137 B2
(45) Date of Patent: Nov. 24, 2026

(54) LIGHT EMITTING DISPLAY DEVICE

(71) Applicant: LG Display Co., Ltd, Seoul (KR)

(72) Inventors: Se-Wan Oh, Paju-si (KR); A-Ra Yoon, Paju-si (KR); Young-Bok Lee, Paju-si (KR); Sung-Woo Kim, Paju-si (KR); Yong-Ku Lee, Paju-si (KR); Chi-Yong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 314 days.

(21) Appl. No.: 18/531,903

(22) Filed: Dec. 7, 2023

(65) Prior Publication Data

US 2024/0260407 A1 Aug. 1, 2024

(30) Foreign Application Priority Data

Jan. 31, 2023 (KR) ........................ 10-2023-0012434

(51) Int. Cl.
*H01L 21/78* (2006.01)
*H10K 59/80* (2023.01)
*H10K 59/88* (2023.01)

(52) U.S. Cl.
CPC ....... *H10K 59/873* (2023.02); *H10K 59/8722* (2023.02); *H10K 59/879* (2023.02); *H10K 59/8793* (2023.02); *H10K 59/88* (2023.02)

(58) Field of Classification Search
CPC ............. H10K 59/873; H10K 59/8722; H10K 59/879; H10K 59/8793; H10K 59/88; H10K 50/844; H10K 50/858; H10K 59/12; H10K 59/82; H10K 59/8791
USPC ........................................................... 257/40
See application file for complete search history.

(56) References Cited

U.S. PATENT DOCUMENTS

| | | | | |
|---|---|---|---|---|
| 9,367,162 | B2 * | 6/2016 | Lee | G06F 3/0446 |
| 9,647,233 | B2 * | 5/2017 | Kim | H10K 59/131 |
| 10,135,026 | B2 * | 11/2018 | Moon | H10K 59/131 |
| 11,018,203 | B2 * | 5/2021 | Song | H10K 59/873 |
| 2014/0034919 | A1 * | 2/2014 | Park | H10K 59/8731 257/40 |
| 2018/0197924 | A1 * | 7/2018 | Tada | H10K 77/111 |

(Continued)

FOREIGN PATENT DOCUMENTS

| | | |
|---|---|---|
| JP | 2009-176756 A | 8/2009 |
| KR | 20140064154 A | 5/2014 |

(Continued)

OTHER PUBLICATIONS

Office Action in Korean Appln. No. 10-2023-0012434, mailed on Aug. 20, 2026, 14 pages (with English translation).

*Primary Examiner* — Vu A Vu
(74) *Attorney, Agent, or Firm* — Fish & Richardson P.C.

(57) ABSTRACT

A light emitting display device includes a substrate in which a display region and a non-display area are defined; a light emitting diode which is on the substrate and is provided in a pixel region within the display region; a protective film which is on the light emitting diode, and includes an edge portion an outer side surface of which is located in the non-display region and has an inclined step structure including a plurality of steps; a lens which is on the protective film and corresponds to the pixel region; a planarization film covering the lens; a first adhesive layer which is on the planarization film and located in the display region and the non-display region; and a cover window on the first adhesive layer.

19 Claims, 6 Drawing Sheets

10

(56) References Cited

U.S. PATENT DOCUMENTS

| | | | | |
|---|---|---|---|---|
| 2021/0050555 A1* | 2/2021 | Lee | H10K 59/1213 | |
| 2021/0202917 A1* | 7/2021 | Lee | H10K 59/122 | |
| 2023/0317894 A1* | 10/2023 | Nakamura | G02B 27/0172 | 257/98 |

FOREIGN PATENT DOCUMENTS

| | | | |
|---|---|---|---|
| KR | 20220064014 | A | 5/2022 |
| KR | 20220090955 | A | 6/2022 |
| KR | 20230005065 | A | 1/2023 |

* cited by examiner

LIGHT EMITTING DISPLAY DEVICE

CROSS-REFERENCE TO RELATED APPLICATION

The present application claims the priority of Korean Patent Application No. 10-2023-0012434 filed on Jan. 31, 2023, which is hereby incorporated by reference in its entirety.

BACKGROUND

Field of the Disclosure

The present disclosure relates to a light emitting display device.

Description of the Background

Recently, flat panel display devices, which have excellent characteristics such as thinness, light weight, and low power consumption, have been widely developed and applied to various fields.

Among the flat panel display devices, a light emitting display device equipped with a light-emitting element such as a light emitting diode is a display device in which charges are injected into a light emitting layer formed between an anode and a cathode, and electrons and holes pair up and then annihilate to emit light.

Recently, to increase light efficiency, a lens is provided on an encapsulation layer covering the light emitting diode, and the lens is covered with a planarization layer. Meanwhile, in a case of a light emitting display device applied to automobiles, etc., a thick protective film may be formed below the lens to secure a focal length between the light emitting diode and the lens.

Due to the thick protective film, a level difference (or step difference) at a peripheral portion of the display device increases, which causes air to be generated on an attachment surface of an adhesive layer that attaches the cover window, thereby causing the cover window to lift.

SUMMARY

Accordingly, the present disclosure is directed to a light emitting display device that substantially obviates one or more of the problems due to limitations and disadvantages of the related art.

More specifically, the present disclosure is to provide a light emitting display device which may improve lifting of an adhesive layer attaching a cover member.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the present disclosure, as embodied and broadly described herein, a light emitting display device includes a substrate in which a display region and a non-display area are defined; a light emitting diode which is on the substrate and is provided in a pixel region within the display region; a protective film which is on the light emitting diode, and includes an edge portion an outer side surface of which is located in the non-display region and has an inclined step structure including a plurality of steps; a lens which is on the protective film and corresponds to the pixel region; a planarization film covering the lens; a first adhesive layer which is on the planarization film and located in the display region and the non-display region; and a cover window on the first adhesive layer.

In another aspect of the present disclosure, a light emitting display device includes: a substrate in which a display region and a non-display region are defined; a light emitting diode which is on the substrate and is provided in a pixel region within the display region; a protective film which is on the light emitting diode, and includes an edge portion having an outer side surface located in the non-display region; a lens which is on the protective film and corresponds to the pixel region; a planarization film covering the lens; a plurality of dam patterns disposed on the edge portion of the protective film; a first adhesive layer which is located on the planarization film and the dam pattern and in the display region and the non-display region; and a cover window on the first adhesive layer, wherein at least part of the plurality of dam patterns decrease in height of top end thereof along an outward direction.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this disclosure, illustrate aspects of the disclosure and together with the description serve to explain the principles of the disclosure.

In the drawings.

DETAILED DESCRIPTION

Figure 1:
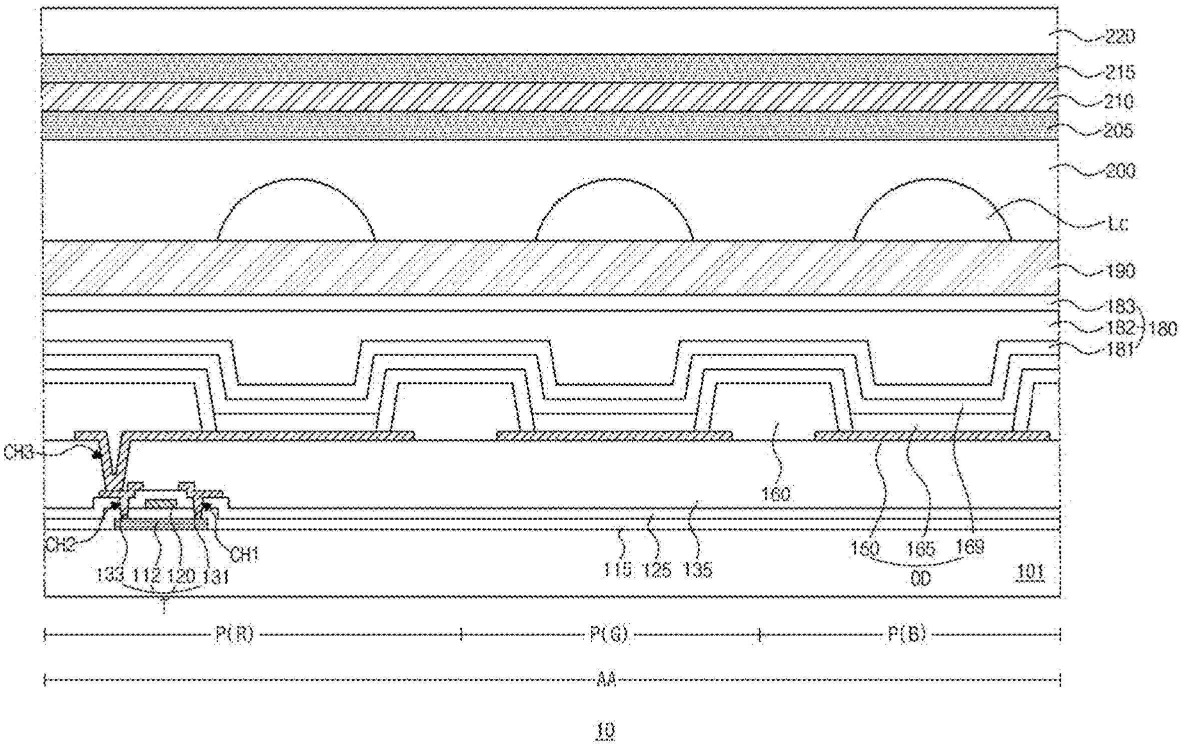
FIG. 1 is a cross-sectional view schematically illustrating pixel regions of a light emitting display device according to a first aspect of the present disclosure.

Advantages and features of the present disclosure and methods of achieving them will be apparent with reference to the aspects described below in detail with the accompanying drawings. However, the present disclosure is not limited to the aspects disclosed below, but may be realized in a variety of different forms, and only these aspects allow the present disclosure to be complete. The present disclosure is provided to fully inform the scope of the disclosure to the skilled in the art of the present disclosure, and the present disclosure may be defined by the scope of the claims.

The shapes, sizes, proportions, angles, numbers, and the like disclosed in the drawings for explaining the aspects of the present disclosure are illustrative, and the present disclosure is not limited to the illustrated matters. The same reference numerals refer to the same components throughout the description.

Furthermore, in describing the present disclosure, if it is determined that a detailed description of the related known technology unnecessarily obscure the subject matter of the present disclosure, the detailed description thereof may be omitted. When 'comprising', 'including', 'having', 'consisting', and the like are used in this disclosure, other parts may be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', and the like, one or more other parts may be positioned between such two parts unless 'right' or 'directly' is used.

In the case of a description of a temporal relationship, for example, when a temporal precedence is described as 'after', 'following', 'before', and the like, cases that are not continuous may be included unless 'directly' or 'immediately' is used.

In describing components of the present disclosure, terms such as first, second and the like may be used. These terms are only for distinguishing the components from other components, and an essence, order, or number of the components is not limited by the terms. Further, when it is described that a component is "connected," "coupled" or "contact" to another component, the component may be directly connected or contact the another component, but it should be understood that other component may be "interposed" between the components.

Respective features of various aspects of the present disclosure may be partially or wholly connected to or combined with each other and may be technically interlocked and driven variously, and respective aspects may be independently implemented from each other or may be implemented together with a related relationship.

Hereinafter, aspects of the present disclosure are described in detail with reference to the drawings. Meanwhile, in the following aspects, the same and like reference numerals are assigned to the same and like components, and detailed descriptions thereof may be omitted.

FIG. 1 is a cross-sectional view schematically illustrating pixel regions of a light emitting display device according to a first aspect of the present disclosure.

Prior to a detailed description, the light emitting display device 10 according to the first aspect of the present disclosure may include any type of display device that displays images with a light emitting diode OD which is a self-luminescent emitting element.

In this aspect, for convenience of explanation, an organic light emitting display device is used as the light emitting display device 10 by way of example.

Referring to FIG. 1, the light emitting display device 10 of this aspect may be a top emission type display device in which light is output toward a top from a substrate 101 to display an image.

On the substrate 101 of the light emitting display device 10, a plurality of pixel regions P may be arranged in a display region AA for displaying an image. Meanwhile, although not specifically shown, a plurality of gate lines extending along a row direction and a plurality of data lines extending along a column direction may be formed on the substrate 101. Each pixel region P may be connected to the corresponding gate line and data line.

The plurality of pixel regions (P) may include pixel regions that form a unit pixel for displaying a color image and display first, second and third as different colors, for example, red (R), green (G), and blue (B) pixel regions that respectively display red, green, and blue.

In each pixel region P, a plurality of thin film transistors T, at least one capacitor, and the light emitting diode OD may be formed on the substrate 101. Meanwhile, in FIG. 1, for convenience of explanation, one thin film transistor T, for example, a driving thin film transistor T in the red (R) pixel region P is shown.

In more detail, a semiconductor layer 112 may be formed on the substrate 101. The semiconductor layer 112 may be made of amorphous silicon, polycrystalline silicon, or an oxide semiconductor material, but is not limited thereto.

The semiconductor layer 112 may include a central channel region, and source and drain regions on both sides.

A gate insulating layer 115, which is as an insulating layer made of an insulating material, may be formed on the semiconductor layer 112. The gate insulating layer 115 may be formed of an inorganic insulating material such as silicon oxide or silicon nitride, but is not limited thereto.

A gate electrode 120 made of a conductive material such as metal may be formed on the gate insulating layer 115 to correspond to the channel region of the semiconductor layer 112.

In addition, a gate line connected to a gate electrode of a switching thin film transistor (not shown) may be formed on the gate insulating layer 115.

An interlayered insulating layer 125, which is an insulating layer made of an insulating material, may be formed on the gate electrode 120.

The interlayered insulating layer 125 may be formed of an inorganic insulating material such as silicon oxide or silicon nitride, or may be formed of an organic insulating material such as benzocyclobutene or photo acryl, but is not limited thereto.

The interlayered insulating layer 125 and the gate insulating layer 115 may be provided with a first contact hole CH1 and a second contact hole CH2 that expose the source region and drain region of the semiconductor layer 112, respectively.

The first contact hole CH1 and the second contact hole CH2 may be located on both sides of the gate electrode 120 and spaced apart from the gate electrode 120.

A source electrode 131 and a drain electrode 133 made of a conductive material such as metal may be formed on the interlayered insulating layer 125.

In addition, a data line may be formed on the interlayered insulating layer 125 to cross the gate line and be connected to a source electrode of the switching thin film transistor.

The source electrode 131 and the drain electrode 133 may be located spaced apart from each other around the gate electrode 120, and be in contact with the source region and the drain region of the semiconductor layer 112 through the first contact hole CH1 and the second contact hole CH2, respectively.

The semiconductor layer 112, the gate electrode 120, the source electrode 131, and the drain electrode 133 configured as above may form the thin film transistor T.

As another example, the thin film transistor T has an inverted staggered structure in which the gate electrode 120 is located below the semiconductor layer 112, and the source electrode 131 and the drain electrode 133 are located over the semiconductor layer 112.

A passivation layer 135, which is an insulating layer made of an insulating material, may be formed on the source electrode 131 and the drain electrode 133.

The passivation layer 135 may be formed of at least one of an inorganic insulating material such as silicon oxide or silicon nitride and an organic insulating material such as benzocyclobutene or photo acryl, but is not limited thereto.

A third contact hole (or drain contact hole) CH3 exposing the drain electrode 133 may be formed in the passivation layer 135.

On the passivation layer 135, a first electrode (or anode) 150 may be formed in each pixel region P.

The first electrode 150 may include a metal material with high reflectance. For example, the first electrode 150 may include Al, Ag, Ti, or APC (Al—Pd—Cu) alloy, but is not limited thereto.

Meanwhile, the first electrode 150 may be formed as a single-layer structure or a multi-layer structure. In a case of forming a multi-layer structure, the first electrode 150 may be configured in, for example, a laminated structure of Al and Ti (e.g., Ti/Al/Ti), a laminated structure of Al and ITO (e.g., ITO/Al/ITO), a laminated structure of APC alloy and ITO (e.g., ITO/APC/ITO), but is not limited thereto.

A bank 160 may be formed on the first electrode 150 to cover an edge of the first electrode 150. The bank 160 may be arranged along a boundary of the pixel region P.

The bank 160 may be formed of, for example, at least one of an acrylic resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and photoresist, but is not limited thereto.

The bank 160 configured as above may have an opening therein exposing the first electrode 150 of each pixel region P.

A light emitting layer 165 may be formed on the first electrode 150 of each pixel region P. The light emitting layer 165 may contact the first electrode 150 exposed through the opening of the bank 160.

The light emitting layer 165 may be formed by each pixel region P or may be formed continuously substantially along the entire surface of the substrate 101 corresponding to all pixel regions P in the display region AA. In this aspect, for convenience of explanation, the case where the light emitting layer 165 is formed in each pixel region P is taken as an example.

The light emitting layer 165 of each pixel region P may be formed of a white light emitting layer that emits white light. As another example, the light emitting layer 165 of each pixel region P may be formed of a light emitting layer that emits the color of the corresponding pixel region P, for example, the red (R), green (G), and blue (B) pixel regions P may include the corresponding red (R), green (G), and blue (B) light emitting layers.

A second electrode (or cathode) 169 may be formed on the light emitting layer 165.

Here, the second electrode 169 may be formed of a transparent electrode with transparent characteristics, and in this case, it may be formed of a transparent conductive material such as ITO.

Alternatively, in the case of implementing a micro cavity effect, the second electrode 169 may be configured to include a transflective electrode layer having transflective characteristics, and may be formed in a multi-layer structure including the transflective electrode layer. The transflective electrode layer of the second electrode 169 may be formed of a metal material such as magnesium (Mg), silver (Ag), or an alloy of magnesium (Mg) and silver (Ag), but is not limited thereto. The metal material may be formed to a thickness thin enough to realize transflective characteristics.

The first electrode 150, the light emitting layer 165, and the second electrode 169 arranged as above in the opening in the pixel region P may form the light emitting diode OD.

The light emitting diode OD may emit light from the light emitting layer 165 interposed between the first and second electrodes 150 and 169, and the light emitted in this way may travel upward and be output.

An encapsulation layer 180 may be formed on the second electrode 169. The encapsulation layer 180 may serve to prevent oxygen or moisture from penetrating into the light emitting diode OD.

The encapsulation layer 180 may include, for example, at least one inorganic layer and at least one organic layer.

For example, the encapsulation layer 180 may include a first encapsulation layer 181 made of an inorganic material, a second encapsulation layer 182 made of an organic material on the first encapsulation layer 181, and a third encapsulation layer 183 made of an inorganic material on the second encapsulation layer 182.

The first and third encapsulation layers 181 and 183 may be formed of an inorganic material such as, for example, silicon nitride, aluminum nitride, zirconium nitride, titanium nitride, hafnium nitride, tantalum nitride, silicon oxide, aluminum oxide, or titanium oxide.

The second encapsulation layer 182 may be formed of an organic material such as, for example, acrylic resin or epoxy resin.

A protective film 190 may be formed on the encapsulation layer 180. The protective film 190 may be a thick insulating film with a relatively thick thickness (e.g., 1 μm or more).

The protective film 190 may be formed of an organic material, for example, an acrylic resin or an epoxy resin.

On the protective film 190, a plurality of lenses Lc respectively corresponding to the plurality of pixel regions P may be formed. The lens Lc may have a convex semicircular shape.

The lens Lc may function to collect light due to its convex semicircular shape, thereby improving a front luminance of the light emitting display device 10.

The lens Lc may be formed of a material having a high refractive index. For example, the lens Lc may have a refractive index of approximately 1.6 to 1.8, but is not limited thereto.

As above, the lens Lc may be formed to correspond to each pixel region P, that is, the pixel area P and the lens Lc may have a one-to-one correspondence.

Meanwhile, although not specifically shown, for example, a color filter pattern corresponding to each pixel region P may be disposed between the lens Lc and the encapsulation layer 180. In some cases, a touch electrode may be disposed between the lens Lc and the color filter pattern.

A planarization film 200 may be formed on the lens Lc and the protective film 190 to planarize the substrate.

The planarization film 200 may have a refractive index that is smaller than that of the lens Lc therebelow, for example, a refractive index of approximately 1.4 to 1.5.

The planarization film 200 may be formed in a form of a thick film to planarize the substrate surface on which the lens Lc is formed. For example, the planarization film 200 may have a thickness of approximately 18 μm to 22 μm, but is not limited thereto.

A polarizing film 210 may be disposed on the planarization film 200. The polarizing film 210 may serve to prevent reflection of external light.

The polarizing film 210 may be attached to the planarization film 200, for example, through a first adhesive layer 205.

A cover window 220, which is a protective member that protects the display surface of the light emitting display device 10, may be disposed on the polarizing film 210. The cover window 220 may be made of, for example, glass or plastic.

The cover window 220 may be attached to the polarizing film 210, for example, through a second adhesive layer 215.

Hereinafter, a structure of a peripheral portion (or edge portion) of the light emitting display device 10 of this aspect is described with further reference to FIG. 2.

Figure 2:
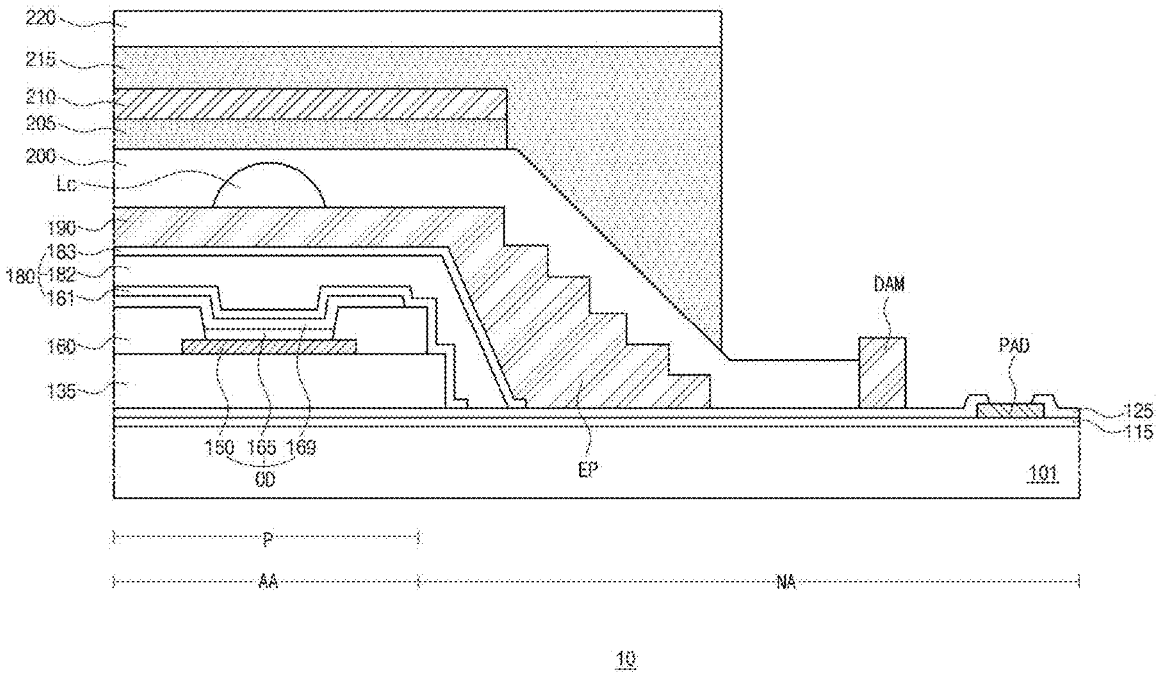
FIG. 2 is a cross-sectional view schematically illustrating a peripheral portion of a light emitting display device according to a first aspect of the present disclosure.

FIG. 2 is a cross-sectional view schematically illustrating a peripheral portion of a light emitting display device according to a first aspect of the present disclosure.

In FIG. 2, for convenience of explanation, the pixel region P located at an edge (i.e., outermost) of the display region AA, and the non-display region NA outside the display region AA are shown. Meanwhile, the non-display region NA in FIG. 2, which is a portion of a non-display region NA of the substrate 101 connected to a driving circuit, that is, a portion of a non-display region where a pad (or pad electrode) PAD receiving a signal output from the driving circuit is located, is shown by way of example.

Referring to FIG. 2, in the light emitting display device 10, as a structure for alleviating a level difference (or step difference) of the peripheral portion of the substrate 101, for example, an edge portion EP of the thick protective film 190 may have a step-shaped inclined structure.

In this regard, the protective film 190 may be formed on the substrate 101 to have a shape extending from the display region AA to the non-display region NA.

The protective film 190 may include the edge portion EP corresponding to a boundary portion between the display region AA and the non-display region NA.

The outer side surface (or end surface) of the edge portion EP of the protective film 190 may have a plurality of steps (or step portions), for example, N (N is a natural number of 5 or more) steps whose heights decrease toward the outside of the non-display region NA.

By forming the protective film 190 so that the outer side surface of the edge portion EP has a step-shaped inclined structure, an overall level difference of the edge portion EP of the protective film 190 may be made gentle.

In this regard, in the related art, the outer side surface of the edge portion EP of the protective film 190 has a steeply inclined structure, and accordingly, the level difference of the edge portion EP of the protective film 190 is very large.

On the other hand, in this aspect, by forming the edge portion EP of the protective film 190 in the step shape, the entire edge portion EP has the gently inclined structure, and accordingly, the level difference of the edge portion EP of the protective film 190 may be alleviated.

Accordingly, the level difference of the portion of the non-display area NA where the outer side surface of the edge portion EP of the thick protective film 190 is located may be improved, so that an adhesion of the second adhesive layer 215 which is attached to the stepped portion of the non-display area NA may be improved.

The structure of the peripheral portion of the light emitting display device 10 with the improved level difference as described above is described in more detail.

Referring to FIG. 2 along with FIG. 1, the pad PAD may be formed in the non-display region NA of the substrate 101. As mentioned above, the pad PAD may be electrically connected to an output terminal of the driving circuit to receive a driving signal (e.g., gate signal, data signal, etc.) output from the driving circuit.

The pad PAD may be formed, for example, of the same metal material of and in the same processes of forming the gate electrode 120 or the source and drain electrodes 131 and 133. In this aspect, for convenience of explanation, the case where the pad PAD is formed in the same process as the gate electrode 120 is taken as an example.

The pad PAD may be placed at an edge portion close to an outer edge of the non-display region NA.

Meanwhile, a dam DAM may be formed in the non-display region NA of the substrate 101. The dam DAM may be located, for example, between a region where the pad PAD is formed, and the edge portion EP of the protective film 190.

In this aspect, for convenience of explanation, the case where one dam DAM is formed is shown as an example. As another example, a plurality of dams DAM may be arranged. In summary, at least one dam DAM may be provided.

At least a portion of the dam DAM may be formed of, for example, an organic material that forms the protective film 190. For example, the dam DAM may be formed of the same material as the protective film 190 in the process of forming the protective film 190.

As another example, the dam DAM may be formed in a multi-layer structure, which includes a layer formed of the same material as the bank 160, and another layer formed of the same material as the protective film 190 on the layer of the same material as the bank 160.

In this aspect, for convenience of explanation, the case where the dam DAM is formed at the same layer as and of the same material as the protective film 190 is taken as an example.

Meanwhile, a height of the dam DAM may be less than or equal to a height of the protective film 190, but is not limited thereto.

By forming the dam DAM as above, it is possible to prevent the planarization film 200 covering the lens Lc from flowing in an outer direction of the non-display region NA and remaining as a residual film on the pad PAD.

In this regard, for example, the planarization film 200 may be coated on the display region AA through an inkjet process in a solution state. In this case, the planarization film 200 is applied in a form of a thick film to flatten the substrate having the lens Lc, so the planarization film 200 may flow into the non-display region NA and cover the pad PAD to remain as a residual film.

To improve this residual film phenomenon, the dam DAM may be formed inside the pad PAD. Accordingly, the flow in the outward direction of the planarization film 200 may be blocked by the dam DAM, so that it is possible to alleviate the presence of the thick planarization film 200 in the form of a residual film on the pad PAD.

Meanwhile, the flow of the planarization film 200 may be alleviated by the step-shaped inclined structure of the protective film 190.

In this regard, the edge portion EP of the protective film 190 has the step shape, thereby increasing its surface area. Due to the step-shaped structure of the edge portion EP of the protective film EP, the flow in the outward direction of the planarization film 200 may be alleviated.

Meanwhile, the polarizing film 210 and the cover window 220 may be located in the non-display region NA.

In this regard, for example, the polarizing film 210 and the cover window 220 may extend into the non-display region NA, and their end portions may be located in the non-display region NA.

At this time, in this aspect, the case where the end of the polarizing film 210 is located inside the end of the protective film 190, and the end of the cover window 220 is located corresponding to the end of the protective film 190 is taken as an example.

In this case, the first adhesive layer 205 below the polarizing film 210 may be attached to, for example, to the flat top surface of the planarization film 200.

In addition, the second adhesive layer 215 that attaches the cover window 220 to the polarizing film 210 may be attached, for example, over the edge portion EP of the protective film 190. In this aspect, for convenience of explanation, the case where the planarization film 200 is located along the inclined steps of the edge portion EP of the protective film 190 is taken as an example, and in this case, the second adhesive layer 215 may be attached to a portion of the planarization film 200 that is gently inclined and has a reduced level difference.

As such, the second adhesive layer 215 may be attached along the portion of the planarization film 200 where the level difference is reduced, so that the adhesion of the second adhesive layer 215 increases. Thus, the generation of air (bubble) at the attachment surface of the second adhesive layer 215 may be improved (or minimized).

In this regard, in the related art, since the edge portion EP of the protective film 190 has a steeply inclined stepped structure, the adhesion of the second adhesive layer 215 is reduced, and air may flow into the attachment surface of the second adhesive layer 215. Due to this air, the problem of the cover window 220 lifting occurs as a result.

On the other hand, in this aspect, by forming the edge portion EP of the protective film 190 in the step shape, the level difference at this portion may be alleviated and the adhesion of the second adhesive layer 215 may be increased. Accordingly, the generation of air at the attachment surface of the second adhesive layer 215 may be reduced.

Therefore, the lifting phenomenon of the cover window 220 caused by air generated at the attachment surface may be improved.

Figure 3:
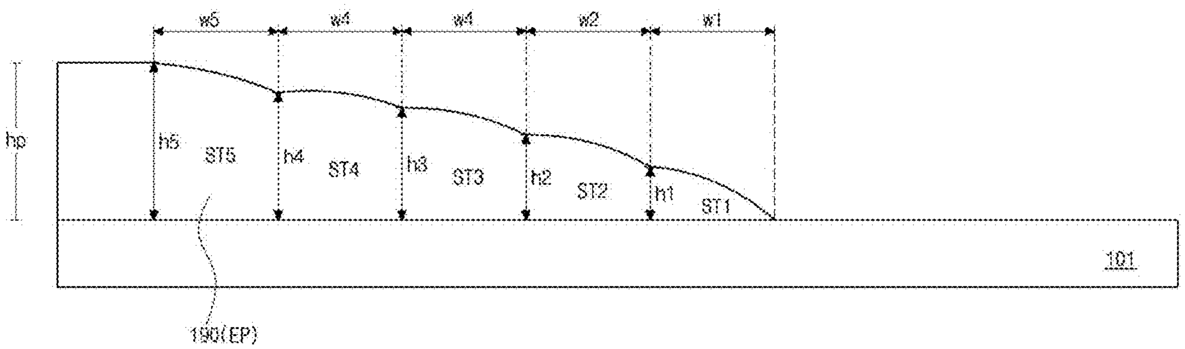
FIG. 3 is a view schematically illustrating an example of a step-shaped structure of an edge portion of a protective film according to the first aspect of the present disclosure.

Meanwhile, the step structure of the edge portion EP of the protective film 190 is described in more detail with further reference to FIG. 3.

FIG. 3 is a view schematically illustrating an example of a step-shaped structure of an edge portion of a protective film according to the first aspect of the present disclosure.

In FIG. 3, for convenience of explanation, the substrate 101 and the protective film 190 are shown, and a 5-step structure in which the outer side surface of the edge portion EP of the protective film 190 has 5 steps (or 5 step portions) ST1 to ST5 is taken as an example.

In the step structure of the protective film 190, for example, each step may have a roughly (or gently) inclined shape along the outer direction, and accordingly, a height difference may occur between an inner end and an outer end of each step. Such the step structure may be produced, for example, by forming a slit pattern corresponding to the step structure in a photo mask and conducting an exposure process.

In this regard, for convenience of explanation, it is assumed that a height (or thickness) hp of the top surface of the flat portion of the protective film 190 located inside the step structure is referred to as 100%; a height h5 of an inner end of a fifth step ST5, which is the highest step, is referred to as a fifth height h5; then a height h4 of an inner end of a fourth step ST4 (or a height h4 of an outer end of the fifth step ST5) is referred to as a fourth height h4; then a height h3 of an inner end of a third step ST3 (or a height h3 of an outer end of the fourth step ST4) is referred to as a third height h3; then a height h2 of an inner end of a second step ST2 (or a height h2 of an outer end of the third step ST3) is referred to as a second height h2; and then a height h1 of an inner end of a first step ST1, which is the last step, (or a height h1 of an outer end of the second step ST2) is referred to as a first height h1.

In this case, the fifth height h5 of the inner end of the fifth step ST5 may be 100% substantially equal to the height hp of the top surface of the protective film 190, and the fourth height h4 of the outer end of the fifth step ST5 may be reduced by approximately 15% or more from the fifth height h5. In this aspect, the case where the fourth height h4 is reduced by approximately 15% and is 85% is taken as an example. In this case, the height difference of the fifth step ST5 (i.e., the height difference between the inner end and the outer end of the fifth step ST5) is approximately 15%.

In addition, the first height h1 of the inner end of the lowest first step ST1 may be approximately 30% to 45%. In this aspect, the case where the first height h1 is approximately 34% is taken as an example. In this case, the height difference of the first step ST1 is approximately 34%.

Meanwhile, the height difference of each of the fourth to second steps ST4 to ST2 located between the fifth step ST5 and the first step ST1 (or the height difference of each of the fourth to first steps ST4 to ST1) may, for example, increase toward the outside. In this regard, for example, the difference between the fourth height h4 of the inner end of the fourth step ST4 and the third height h3 of the outer end of the fourth step ST4 may be approximately 15%; the difference between the third height h3 of the inner end of the third step ST3 and the second height h2 of the outer end of the third step ST3 may be approximately 16%; and the difference between the second height h2 of the inner end of the second step ST2 and the first height h1 of the outer end of the second step ST2 may be approximately 20%. However, the height of each step is not limited to the above value.

In addition, when the height difference of each step is formed under the above conditions, the height (or maximum height) hp of the top surface of the flat portion of the protective film 190 may be, for example, approximately 6 μm to 20 μm, but is not limited thereto, and the height difference of each step may be set to be, for example, 5 μm or less, but is not limited thereto.

Meanwhile, widths (or lengths) w1 to w5 of the steps ST1 to ST5 forming the step structure may be adjusted in various ways. For example, the first to fifth widths w1 to w5 of the first to fifth steps ST1 to ST5 may be the same (or constant). As another example, the widths of the steps may become wider or narrower along the outward direction.

Figure 4:
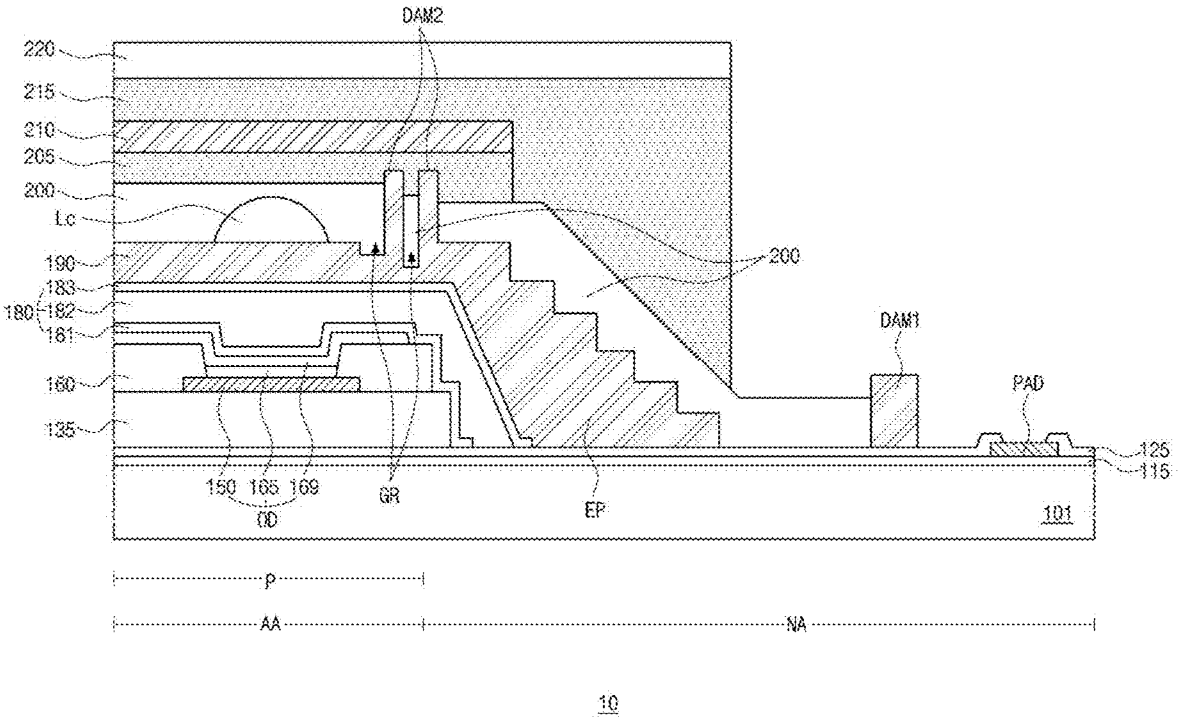
FIG. 4 is a cross-sectional view schematically illustrating a peripheral portion of a light emitting display device according to a second aspect of the present disclosure.

FIG. 4 is a cross-sectional view schematically illustrating a peripheral portion of a light emitting display device according to a second aspect of the present disclosure.

In the following description, detailed descriptions of configurations identical or similar to those of the above-described first aspect may be omitted.

Referring to FIG. 4, in the light emitting display device 10 of this aspect, at least one dam DAM2 may be formed at the edge portion EP of the protective film 190. For example, the at least one dam DAM2 located inside the outer side surface of the step structure may be formed at the edge portion EP of the protective film 190. In this aspect, for convenience of explanation, the case in which two or more dams DAM2 are formed is taken as an example.

Here, to distinguish the dam DAM2 from the first dam DAM1 located outside the protective film 190, the dam DAM2 located at the edge portion EP of the protective film 190 may be referred to as a second dam DAM2.

For example, the second dam DAM2 may be formed to protrude upward from the top surface of the protective film 190. In other words, the second dam DAM2 may be made of the same material as the protective film 190 and may have an extended shape that protrudes upward.

For example, the second dam DAM2 may be formed so that its top end has a height higher than the top surface of the planarization film 200, but is not limited thereto and may have a height lower than the top surface of the planarization film 200.

In addition, at least one of the second dams DAM2 may be located, for example, at an edge of the display region AA, and more particularly, in a non-emission region of the outermost pixel region P (i.e., the non-emission region outside the light emitting diode OD of this pixel region P). Alternatively, at least one of the second dams DAM2 may be located in the non-display region NA. In this aspect, the case where the second dams DAM2 are disposed at the edge of the display region AA is taken as an example.

In this way, when the second dam DAM2 is formed at the edge portion EP of the protective film 190, the flow in the outward direction of the planarization film 200 may be more preemptively blocked.

Moreover, when the second dam DAM2 is formed together with the first dam DAM1, the flow of the planarization film 200 toward the outside of the non-display area NA may be more effectively blocked or controlled.

Accordingly, it is possible to more effectively prevent the thick planarization film 200 from remaining in the form of a residual film on the pad PAD.

Meanwhile, a groove GR recessed in the downward direction may be formed inside the second dam DAM. In this aspect, the case where the groove GR is formed inside each of the two second dams DAM is taken as an example.

In this way, forming the groove GR may have the effect of increasing the height of the second dam DAM. Accordingly, an ability to block the flow of the planarization film 200 may be further improved.

Meanwhile, when two (or more) grooves GR are formed as in this aspect, widths and/or depths of the grooves GR may be different (or differentiated). For example, as shown in FIG. 4, the groove (or first groove) GR located on an inner side (or close to the display region AA) may have a wider width than the groove (or second groove) GR located on an outer side, but not limited thereto and the groove (or first groove) GR located on an inner side (or close to the display region AA) having a narrower width than the groove (or second groove) GR located on an outer side may be true. In addition, the groove GR located on the inner side may have a smaller depth than the groove GR located on the outer side, but not limited thereto and the groove GR located on the inner side having a larger depth than the groove GR located on the outer side may be true.

Figure 5:
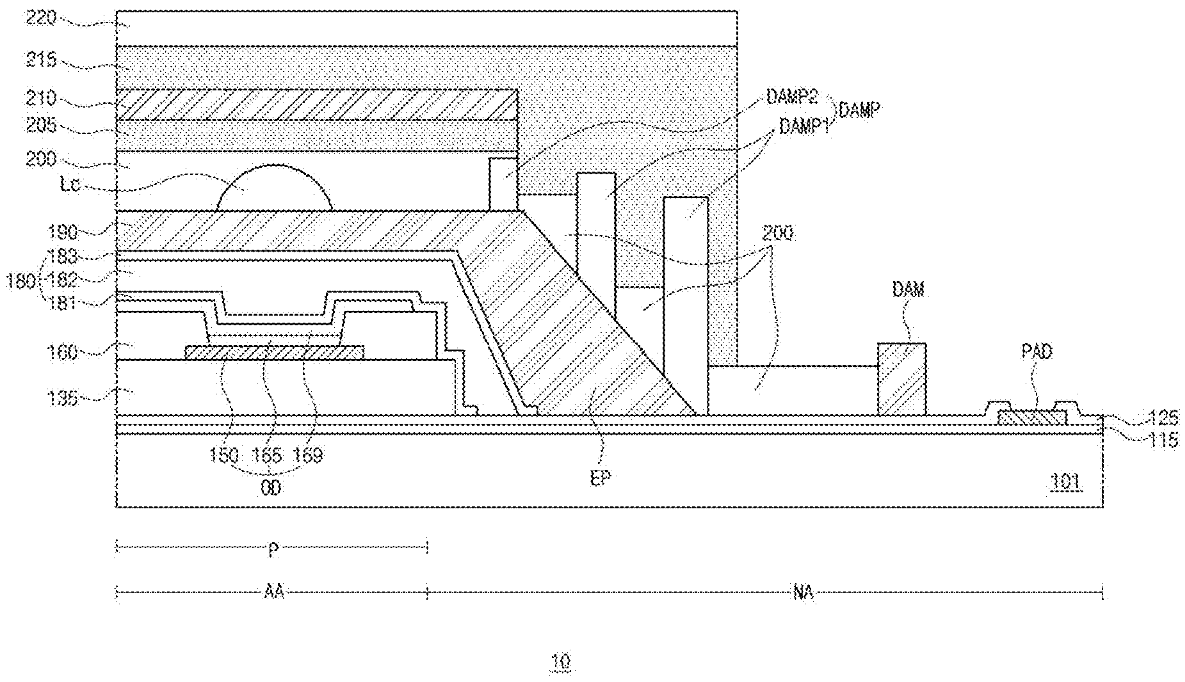
FIG. 5 is a cross-sectional view schematically illustrating a peripheral portion of a light emitting display device according to a third aspect of the present disclosure.

FIG. 5 is a cross-sectional view schematically illustrating a peripheral portion of a light emitting display device according to a third aspect of the present disclosure.

In the following description, detailed descriptions of configurations identical or similar to those of the first and second aspects described above may be omitted.

Referring to FIG. 5, in the light emitting display device 10 of this aspect, a plurality of dam patterns (or dams) DAMP may be formed on the edge portion EP of the protective film 190.

In this aspect, the case where some part DAMP1 of the plurality of dam patterns DAMP is disposed on the inclined outer side surface of the protective film 190, and another part DAMP2 is disposed on the flat portion of the protective film 190 is taken as an example. As another example, the plurality of dam patterns DAMP may include a dam pattern disposed outside the edge portion EP of the protective film 190.

For example, the plurality of dam patterns DAMP may be configured in such a way that their heights decrease in the outward direction.

In this regard, a second dam pattern DAMP2 located on the innermost side may have its top end with the highest height, and heights of top ends of first dam patterns DAMP1 located outside the second dam pattern DAMP2 may decrease as they are located in the outer direction.

In this way, the entire plurality of dam patterns DAMPs may have a so-called step-like (or pseudo-step) structure in which their heights decrease in the outward direction, similar to the step structure of the first aspect described above.

Accordingly, at the edge portion EP of the protective film, the substrate 101 may have a substantially gentle level difference. In this way, since the level difference of the portion of the substrate 101 where the edge portion EP of the protective film 190 is located may be improved, the adhesion of the second adhesive layer 215 increases and air generation may be improved. Accordingly, the lifting phenomenon of the cover window 220 caused by air may be improved.

In addition, by providing the plurality of dam patterns DAMP, it is possible to block the flow in the outer direction of the planarization film 200.

Furthermore, when the dam patterns DAMP, which are located inside the dam DAM, along with the dam DAM are provided, the flow of the planarization film 200 toward the outside of the non-display region NA may be more effectively blocked.

Accordingly, it is possible to more effectively prevent the thick planarization film 200 from remaining in the form of a residual film on the pad PAD.

Meanwhile, the plurality of dam patterns DAMP may be formed, for example, of the same material as and in the same process as the lens Lc, but not limited thereto.

In addition, the multiple dam patterns DAMP may have the same or different widths. For example, the width of the dam pattern DAMP may increase as its thickness (i.e., a distance from its top end to its bottom end) increases, and in this regard, the widths of the dam patterns DAMP may increase in the outward direction.

Figure 6:
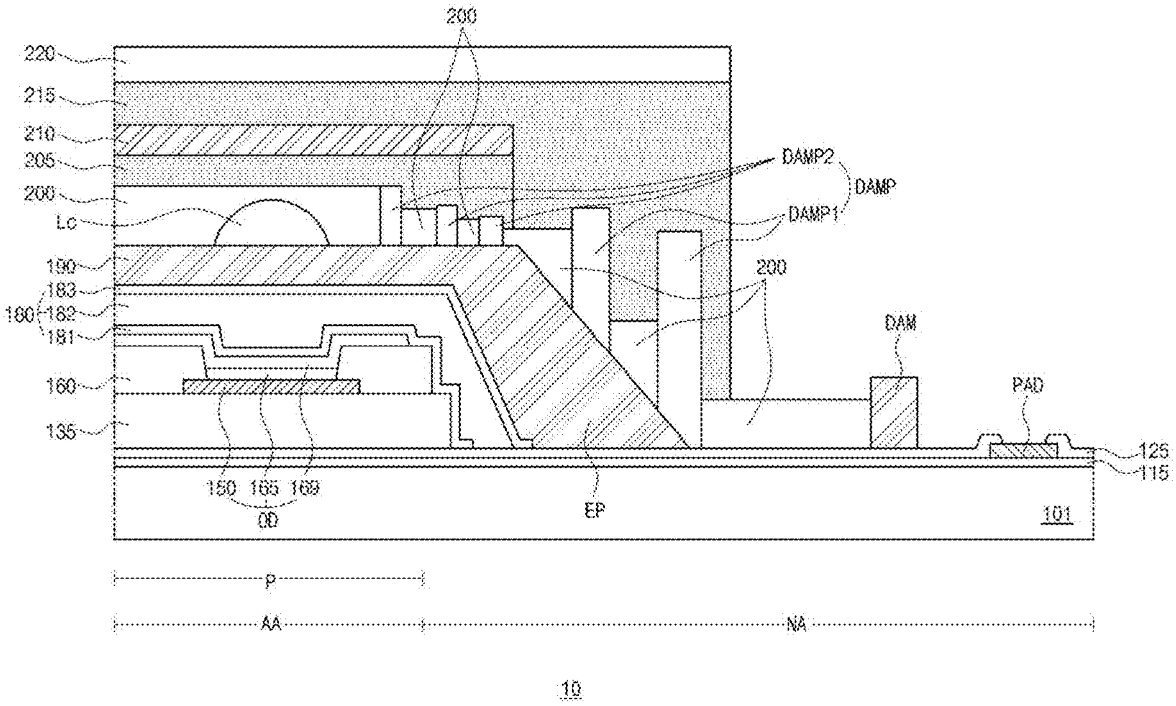
FIG. 6 is a cross-sectional view schematically illustrating a peripheral portion of a light emitting display device according to a fourth aspect of the present disclosure.

FIG. 6 is a cross-sectional view schematically illustrating a peripheral portion of a light emitting display device according to a fourth aspect of the present disclosure.

In the following description, detailed descriptions of configurations identical or similar to those of the first to third aspects described above may be omitted.

Referring to FIG. 6, in the light emitting display device 10 of this aspect, a plurality of dam patterns DAMP may be formed on the edge portion EP of the protective film 190.

In this aspect, the case where some part DAMP1 of the plurality of dam patterns (DAMP) is disposed on the inclined surface of the edge portion EP of the protective film 190, and another part DAMP2 is disposed on the flat portion of the protective film 190 inside the inclined surface of the protective film 190 is taken as an example. As another example, the plurality of dam patterns DAMP may include a dam pattern disposed outside the edge portion EP of the protective film 190.

Regarding the plurality of dam patterns DAMP, a plurality of first dam patterns DAMP1 may be disposed on the outer side surface (i.e., the inclined surface) of the protective film 190. In this case, for example, the first dam patterns DAMP1 may be configured in such a way that their heights decrease in the outward direction, similar to the third aspect.

In addition, a plurality of second dam patterns DAMP2 may be disposed inside the outer side surface of the protective film 190. In this case, for example, the second dam patterns DAMP2 may be configured in such a way that their heights decrease in the outward direction. On the contrary, the second dam patterns DAMP2 may be configured in such a way that their heights increase in the outward direction.

In this way, when the plurality of second dam patterns DAMP2 are provided, it is possible to more effectively block the flow of the planarization film 200 in the outward direction. Moreover, since the plurality of second dam patterns DAMP2 are located close to the display region AA (or at least part of the plurality of second dam patterns DAMP2 is adjacent at the non-emission region of the outermost pixel region P of the display area AA), most of the planarization film 200 may be located within the display region AA, and the flatness of the planarization film 200 within the display region AA may be improved.

Furthermore, when the dam patterns DAMP, which are located inside the dam DAM, along with the dam DAM, are provided, the flow of the planarization film 200 toward the outside of the non-display region NA may be more effectively blocked.

Accordingly, it is possible to more effectively prevent the thick planarization film 200 from remaining in the form of a residual film on the pad PAD.

In addition, the entire plurality of dam patterns DAMP may have a so-called step-like structure in which their heights generally decrease in the outward direction, similar to the third aspect described above.

Accordingly, at the edge portion EP of the protective film, the substrate 101 may have a substantially gentle level difference. In this way, since the level difference of the portion of the substrate 101 where the edge portion EP of the protective film 190 is located may be improved, the adhesion of the second adhesive layer 215 increases and air generation may be improved. Accordingly, the lifting phenomenon of the cover window 220 caused by air may be improved.

Meanwhile, the plurality of dam patterns DAMP may be formed, for example, of the same material as and in the same process as the lens Lc, but not limited thereto.

In addition, the second dam pattern DAMP2 with the highest height of top end (e.g., the innermost second dam pattern DAMP2 in FIG. 6) among the second dam patterns DAMP2 may be higher than the first dam pattern DAMP1 with the highest height of top end (e.g., the innermost first dam pattern DAMP1 in FIG. 6) among the first dam patterns DAMP1, but not limited thereto.

In addition, the second dam patterns DAMP2 may have a smaller width than the first dam patterns DAMP1 located outside the second dam patterns.

As described above, according to aspects of the present disclosure, the edge portion of the thick protective film may be formed in the step-shaped inclined structure to alleviate the level difference. Accordingly, the adhesive layer attached to the portion of the substrate where the level difference is reduced has increased adhesion, so that the generation of an air layer at the attachment surface of the adhesive layer may be alleviated. Accordingly, the lifting phenomenon of the cover window caused by the air layer may be alleviated.

In addition, the dam patterns in the step-like form with their heights decreasing in the outward direction may be formed on the edge portion of the thick protective film to alleviate the level difference. Accordingly, the adhesive layer attached to the portion of the substrate where the level difference is reduced has increased adhesion, so that the generation of an air layer on the attachment surface of the adhesive layer may be improved. Accordingly, the lifting phenomenon of the cover window caused by the air layer may be improved.

Moreover, the dam and/or the dam patterns may be formed at the edge portion of the protective film and/or near the pad. Accordingly, it is possible to block the flow in the outer direction of the thick planarization film, the remaining film of the planarization film on the pad may be alleviated, and the flatness of the planarization film within the display region may also be improved.

It will be apparent to those skilled in the art that various modifications and variation may be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting display device, comprising:

a substrate in which a display region and a non-display area are defined;

a light emitting diode disposed on the substrate and provided in a pixel region within the display region;

a protective film disposed on the light emitting diode, and including an edge portion an outer side surface of which is located in the non-display region and having an inclined step structure including a plurality of steps;

a lens disposed on the protective film and corresponding to the pixel region;

a planarization film covering the lens;

a first adhesive layer disposed on the planarization film and located in the display region and the non-display region; and a cover window disposed directly on the first adhesive layer.

2. The light emitting display device of claim 1, wherein the edge portion of the protective film includes at least one first dam disposed inside the outer side surface of the step structure and protruding upward.

3. The light emitting display device of claim 1, wherein the plurality of steps are N steps (N being a natural number of 5 or more), wherein each of the N steps has an inclined shape along an outward direction, wherein a height difference of a $N^{th}$ step which is the highest among the N steps is 15% or more of a height of a portion of the protective film, which is located inside the outer side surface, wherein a $N-1^{th}$ step to a first step increases in height difference in the outward direction, and wherein a height difference of the first step is 30% to 45% of the height of the portion of the protective film located inside the outer side surface.

4. The light emitting display device of claim 3, wherein widths of the N steps are the same.

5. The light emitting display device of claim 1, further comprising:

a second dam located outside the edge portion of the protective film; and a pad located outside the second dam.

6. The light emitting display device of claim 2, wherein the edge portion of the protective film includes at least one groove disposed inside the at least one first dam and is recessed in a downward direction.

7. The light emitting display device of claim 6, wherein the at least one first dam includes two first dams, the at least one groove includes a first groove and a second groove, the first groove is located inside one of the two first dams, and the second groove is located inside another of the two first dams, and wherein a width of the first groove is greater than that of the second groove located outside the first groove.

8. The light emitting display device of claim 7, wherein a depth of the first groove is smaller than that of the second groove.

9. The light emitting display device of claim 2, wherein a top end of the at least one first dam has a height equal to or greater than that of a top surface of the planarization film.

10. The light emitting display device of claim 1, further comprising:

a second adhesive layer located between the planarization film and the first adhesive layer; and a polarizing film located between the second adhesive layer and the first adhesive layer.

11. The light emitting display device of claim 10, wherein the first adhesive layer is attached over the edge portion of the protective film.

12. A light emitting display device, comprising:

a substrate in which a display region and a non-display region are defined;

a light emitting diode disposed on the substrate and provided in a pixel region within the display region;

a protective film disposed on the light emitting diode, and including an edge portion having an outer side surface located in the non-display region;

a lens disposed on the protective film and corresponding to the pixel region;

a planarization film covering the lens;

a plurality of dam patterns disposed on the edge portion of the protective film;

a first adhesive layer located on the planarization film and the dam pattern and in the display region and the non-display region; and a cover window disposed directly on the first adhesive layer, wherein at least part of the plurality of dam patterns decreases in height of top end thereof along an outward direction.

13. The light emitting display device of claim 12, wherein the plurality of dam patterns include at least one first dam pattern located on the outer side surface, and at least one second dam pattern located inside the outer side surface.

14. The light emitting display device of claim 13, wherein the at least one first dam pattern includes a plurality of first dam patterns and heights of top ends of the plurality of first dam patterns decrease along the outward direction, and wherein a height of a top end of the at least one second dam pattern is greater than the heights of the top ends of the plurality of first dam patterns.

15. The light emitting display device of claim 13, wherein the at least one second dam pattern includes a plurality of second dam patterns and heights of top ends of the plurality of second dam patterns decrease along the outward direction.

16. The light emitting display device of claim 13, wherein the at least one second dam pattern has a width smaller than that of the at least one first dam pattern.

17. The light emitting display device of claim 12, further comprising:

a dam located outside the edge portion of the protective film; and a pad located outside the dam.

18. The light emitting display device of claim 12, further comprising:

a second adhesive layer located between the planarization film and the first adhesive layer; and a polarizing film located between the second adhesive layer and the first adhesive layer.

19. The light emitting display device of claim 18, wherein the first adhesive layer is attached over the edge portion of the protective film.

* * * * *